United States Patent (12)
Sun et al.

(10) Patent No.: US 9,653,496 B2
(45) Date of Patent: May 16, 2017

(54) PREPARATION METHOD OF POLY-SILICON TFT ARRAY SUBSTRATE AND ARRAY SUBSTRATE THEREOF

(71) Applicant: BOE Technology Group Co., Ltd., Beijing (CN)

(72) Inventors: Shuang Sun, Beijing (CN); Jing Niu, Beijing (CN); Fangzhen Zhang, Beijing (CN); Zhijun Lv, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 15/212,871

(22) Filed: Jul. 18, 2016

(65) Prior Publication Data
US 2017/0110488 A1 Apr. 20, 2017

(30) Foreign Application Priority Data
Oct. 16, 2015 (CN) .......................... 2015 1 0673823

(51) Int. Cl.
H01L 21/00 (2006.01)
H01L 27/00 (2006.01)
H01L 29/00 (2006.01)
H01L 27/12 (2006.01)
H01L 29/66 (2006.01)
H01L 21/28 (2006.01)

(52) U.S. Cl.
CPC ...... *H01L 27/1274* (2013.01); *H01L 27/1222* (2013.01); *H01L 27/1288* (2013.01); *H01L 29/6675* (2013.01); *H01L 21/28* (2013.01)

(58) Field of Classification Search
CPC .............. H01L 21/28; H01L 21/82345; H01L 21/0334; H01L 27/1274; H01L 27/1222; H01L 27/1288; H01L 27/105; H01L 29/6675; H01L 29/408; H01L 29/0673
See application file for complete search history.

(56) References Cited

U.S. PATENT DOCUMENTS

| 4,400,865 | A | * | 8/1983 | Goth | H01L 21/0334 257/517 |
| 4,471,522 | A | * | 9/1984 | Jambotkar | H01L 21/28 257/E21.158 |
| 4,488,162 | A | * | 12/1984 | Jambotkar | H01L 21/28 257/398 |
| 4,608,589 | A | * | 8/1986 | Goth | H01L 21/0334 257/477 |

(Continued)

Primary Examiner — Nikolay Yushin
(74) Attorney, Agent, or Firm — Banner & Witcoff, Ltd.

(57) ABSTRACT

A preparation method of a poly-silicon thin film transistor (TFT) array substrate and an array substrate thereof are provided. The preparation method includes: forming a photoresist layer on a poly-silicon layer, and exposing and developing the photoresist layer with a gray tone mask to form patterns of a photoresist completely-reserved region, a photoresist partially-reserved regions and a photoresist completely-removed region; removing part of the poly-silicon layer located in the photoresist completely-removed region, to form patterns of active layers; ashing the photoresist so as to expose part of the active layer located in the photoresist partially-reserved regions and inject P+ ions of high concentration into the part of the active layer, to form doping regions of patterns of source-drain electrodes of a P-type TFT; and stripping off remaining photoresist.

12 Claims, 7 Drawing Sheets

(56) References Cited

U.S. PATENT DOCUMENTS

| | | | | |
|---|---|---|---|---|
| 4,691,219 A | * | 9/1987 | Goth | H01L 21/0334 257/518 |
| 4,758,528 A | * | 7/1988 | Goth | H01L 21/0334 257/377 |
| 7,643,101 B2 | * | 1/2010 | Oh | G02F 1/1368 257/72 |
| 2004/0166616 A1 | * | 8/2004 | Lee | H01L 21/2652 438/197 |

* cited by examiner

US 9,653,496 B2

PREPARATION METHOD OF POLY-SILICON TFT ARRAY SUBSTRATE AND ARRAY SUBSTRATE THEREOF

This application claims priority to and the benefit of Chinese Patent Application No. 201510673823.5 filed on Oct. 16, 2015, which application is incorporated herein in its entirety.

TECHNICAL FIELD

Embodiments of the present disclosure relate to a preparation method of a poly-silicon thin film transistor (TFT) array substrate and an array substrate thereof.

BACKGROUND

Low temperature poly-silicon (LTPS) TFT technology is a next-generations technology after Amorphous-Silicon (a-Si) TFT technology in a flat panel display field. The electron transfer rate of a conventional amorphous silicon material is 0.5 $cm^2/V·S$ only, while the electron transfer rate of a low temperature poly-silicon (LTPS) material may be up to 50-200 $cm^2/V·S$, and therefore, as compared with a conventional amorphous-silicon thin film transistor liquid crystal display (a-Si TFT-LCD), a low temperature poly-silicon thin film transistor liquid crystal display (LTPS TFT-LCD) has advantages such as high resolution, fast response, high brightness and so on, and meanwhile, peripheral driving circuits may be fabricated on a glass base substrate as well, so as to achieve a purpose of integrating system on the glass substrate, and thus space and cost can be saved, and in addition, the low temperature poly-silicon TFT technology is a technical platform for developing an active matrix organic light emitting diode (AM-OLED), so that development of the low temperature poly-silicon TFT technology attracts more attentions in the industry.

Because the preparations process of a low temperature poly-silicon TFT array substrate is complex, there are needed often 10 to 11 times of photolithography process, which increases productions cost of a low temperature poly-silicon display device.

SUMMARY

An embodiment of the disclosure provides a preparation method of a poly-silicon thin film transistor (TFT) array substrate, comprising: forming patterns of light-shielding layers and a poly-silicon layer on a base substrate by a first patterning process; performing a second patterning process, to form a photoresist layer on the poly-silicon layer, and exposing and developing the photoresist layer with a gray tone mask to form patterns of a photoresist completely-reserved region, a photoresist partially-reserved regions and a photoresist completely-removed region; removing part of the poly-silicon layer located in the photoresist completely-removed regions to form patterns of active layers; ashing the photoresist so as to expose part of the active layers located in the photoresist partially-reserved regions and inject P+ ions of high concentrations into the part of the active layers, to form doping regions of patterns of source-drain electrodes of a P-type TFT; and stripping off remaining photoresist.

Another embodiment of the present disclosure provides a poly-silicon thin film transistor (TFT) array substrate prepared by the above mentioned preparation method, wherein, in the array substrate, doping regions of patterns of source-drain electrodes of a P-type TFT is connected with the source-drain electrodes of the P-type TFT through transparent connecting electrodes.

BRIEF DESCRIPTIONS OF THE DRAWINGS

In order to clearly illustrate the technical solutions of the embodiments of the present disclosure, the drawings of the embodiments will be briefly described in the following; it is obvious that the described drawings are only related to some embodiments of the present disclosure and thus are not limitative of the disclosure.

DETAILED DESCRIPTION

In order to make objects, technical details and advantages of the embodiments of the present disclosure apparent, the technical solutions of the embodiment will be described in a clearly and fully understandable way in connections with the drawings related to the embodiments of the present disclosure. It is obvious that the described embodiments are just a part but not all of the embodiments of the present disclosure. Based on the described embodiments herein, those skilled in the art can obtain other embodiment(s), without any inventive work, which should be within the scope of the present disclosure.

Embodiments of the present disclosure provide a preparation method of a low temperature poly-silicon TFT array substrate and an array substrate, which can reduce the number of times of photolithography processes in preparing a low temperature poly-silicon TFT array substrate and further reduce productions cost of a low temperature poly-silicon display device. The term "low temperature poly-silicon" herein refers to that an operation of crystallizing amorphous silicon to poly-silicon is performed at a temperature below 600° C. The term "patterning process" herein refers to a process to form a pattern of circuit, a pattern of via hole, etc. and for example may include a photolithography process to form a photoresist pattern as an etching mask, an etching process along the photoresist pattern, stripping off the photoresist pattern, and so on.

Figure 1:
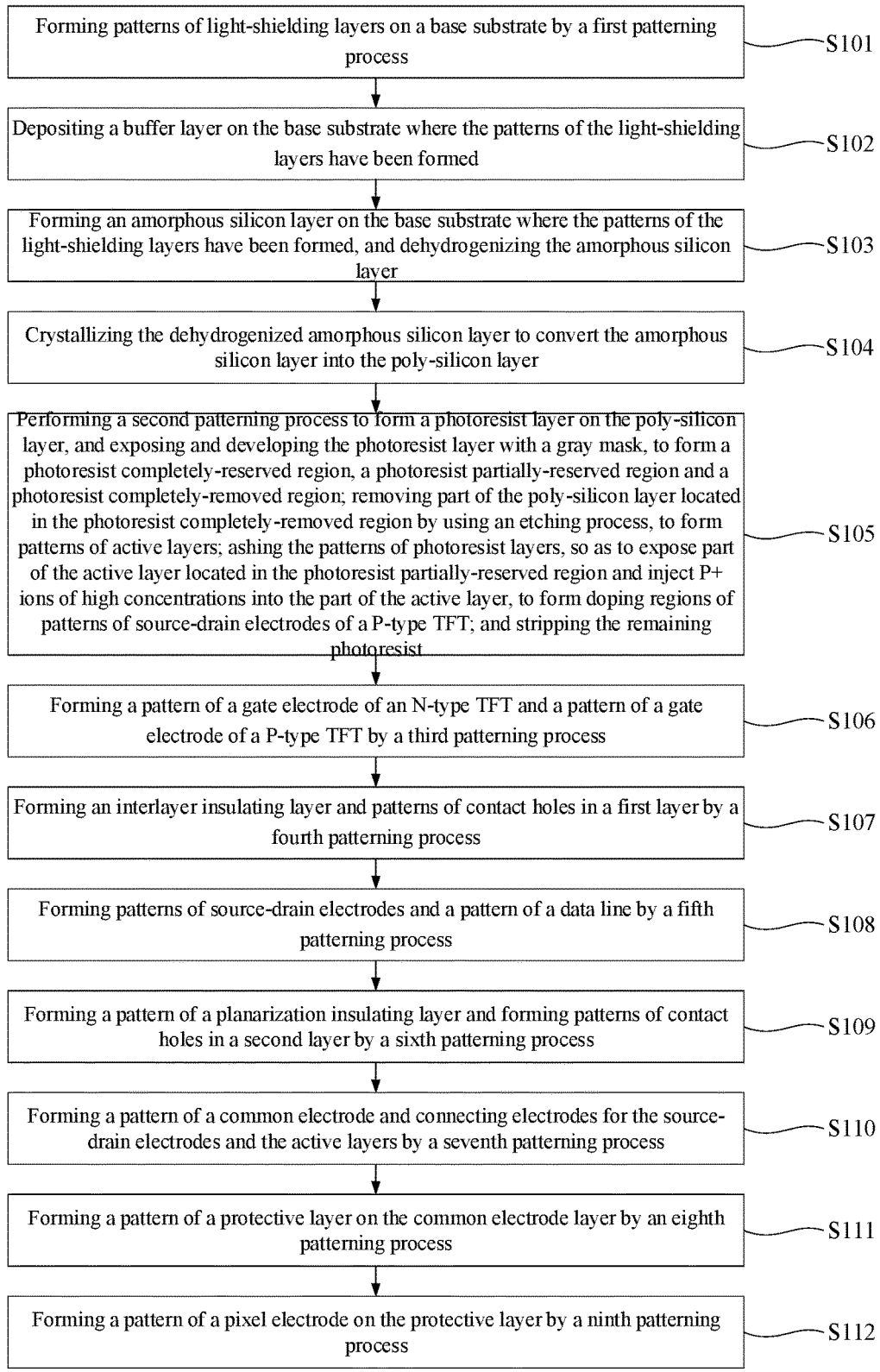
FIG. 1 is a flowchart of a preparation method of a low temperature poly-silicon TFT array substrate provided by an embodiment of the present disclosure.
Figure 2:
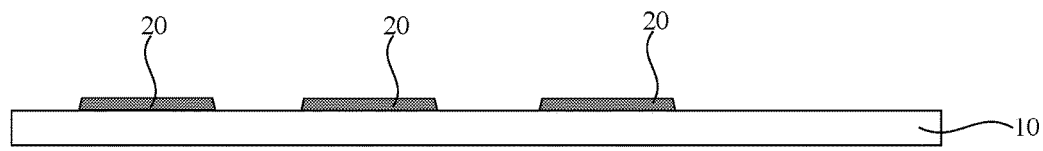
FIG. 2 is a structural schematic diagram of the array substrate after forming patterns of light-shielding layers on a base substrate by a first patterning process.

Referring to FIG. 1 to FIG. 7, an embodiment of the present disclosure provides a preparation method of a low temperature poly-silicon TFT array substrate, which comprises following steps illustrated in FIG. 1:

Step S101: further as illustrated in FIG. 2, forming patterns of light-shielding layers 20 on a base substrate 10 by a first patterning process.

Figure 3:
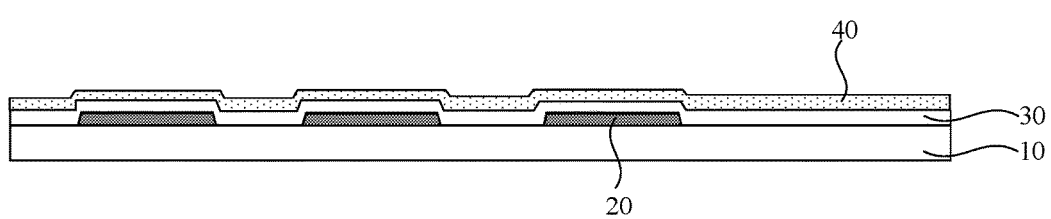
FIG. 3 is a structural schematic diagram of the array substrate after forming an amorphous silicon layer on the base substrate where the patterns of the light-shielding layers have been formed in FIG. 2.

Step S103: further as illustrated in FIG. 3, forming an amorphous silicon layer 40 on the base substrate 10 where the patterns of the light-shielding layers 20 have been formed, and dehydrogenizing the amorphous silicon layer 40.

Figure 4:
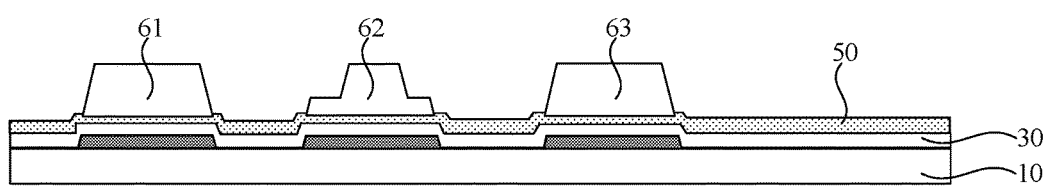
FIG. 4 is a structural schematic diagram of the array substrate after converting the amorphous silicon layer in FIG. 3 to a poly-silicon layer and forming patterns of a photoresist completely-reserved region, a photoresist partially-reserved regions and a photoresist completely-removed region.

Step S104: further as illustrated in FIG. 4, crystallizing the dehydrogenized amorphous silicon layer 40 to convert the amorphous silicon layer 40 into the poly-silicon layer 50.

Step S105: further as illustrated in FIG. 4, performing a second patterning process to form a photoresist layer on the poly-silicon layer 50, and exposing and developing the photoresist layer with a gray tone mask, to form a photoresist completely-reserved region, a photoresist partially-reserved regions and a photoresist completely-removed region, wherein, patterns of the photoresist layers 61 and 63 are the photoresist completely-reserved region, a pattern of the photoresist layer 62 is the photoresist partially-reserved region, and a regions without the photoresist among the patterns of the photoresist layers 61, 62 and 63 is the photoresist completely-removed region. During developing of exposed photoresist, the photoresist in the photoresist completely-reserved region still may be thinned to some extend, but the thickness of the photoresist in the photoresist completely-reserved region is more than the thickness of the photoresist in the photoresist partially-reserved region.

Figure 5:
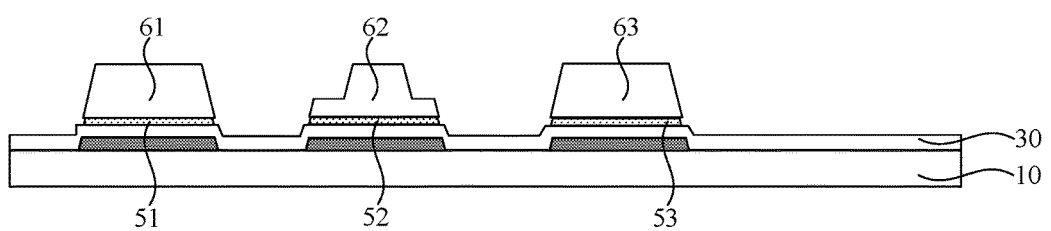
FIG. 5 is a structural schematic diagram of the array substrate after removing part of the poly-silicon layer illustrated in FIG. 4 by using an etching process and forming patterns of active layers.

Further as illustrated in FIG. 5, removing part of the poly-silicon layer 50 located in the photoresist completely-removed regions by using an etching process, to form patterns of active layers 51, 52 and 53.

Figure 6:
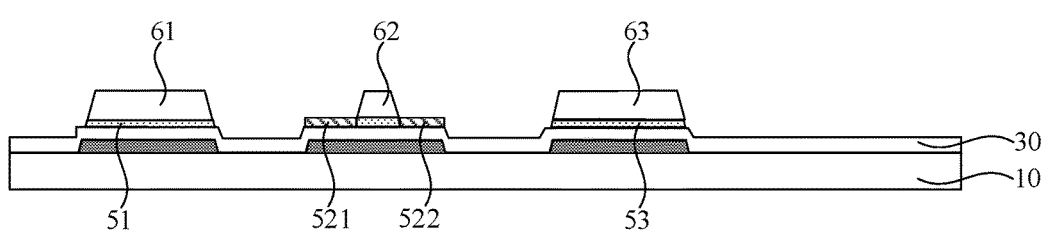
FIG. 6 is a structural schematic diagram of the array substrate after ashing the photoresist illustrated in FIG. 5, and forming doping regions of patterns of source-drain electrodes of a P-type TFT.

Further as illustrated in FIG. 6, ashing patterns of the photoresist layers 61, 62 and 63, so as to expose part of the active layer 52 located in the photoresist partially-reserved regions and inject P+ ions of high concentrations into the part of the active layer 52, to form doping regions 521 and 522 of patterns of source-drain electrodes (that is, the source electrode and the drain electrode) of a P-type TFT.

Figure 7:
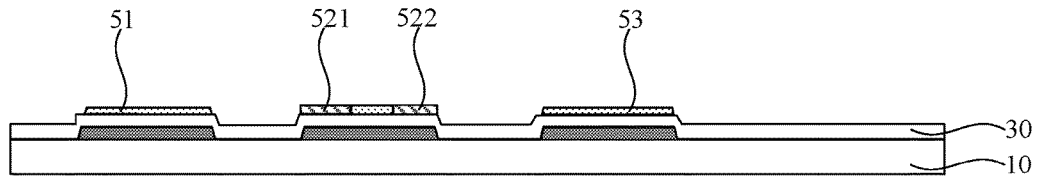
FIG. 7 is a structural schematic diagram of the array substrate after stripping off the photoresist illustrated in FIG. 6.

Further as illustrated in FIG. 7, stripping of the remaining photoresist;

Step S106: forming a pattern of a gate electrode of an N-type TFT and a pattern of a gate electrode of a P-type TFT by a third patterning process.

Step S107: forming an interlayer insulating layer and patterns of contact holes in a first layer by a fourth patterning process.

Step S108: forming patterns of source-drain electrodes and a pattern of a data line by a fifth patterning process.

Step S109: forming a pattern of a planarization insulating layer and forming a pattern of contact holes in a second layer by a sixth patterning process.

Step S110: forming a pattern of a common electrode and connecting electrodes for the source-drain electrodes and the active layers by a seventh patterning process.

In the case where the low temperature poly-silicon TFT array substrate is prepared by the method described above, in step S105, after forming patterns of active layers 51, 52 and 53, the active layer located in the P-type TFT regions is injected with ions of high concentrations to form doping regions of patterns of the source-drain electrodes of the P-type TFT, and the preparation method may save a separate photolithography process for forming the doping regions of the patterns of the source-drain electrodes of the P-type TFT. Further in step S101, connecting electrodes for connecting the active layer and the source-drain electrodes of the P-type TFT are formed while a pattern of the common electrode is formed. The preparation method may save a separate photolithography process for forming the patterns of the source-drain electrodes of the P-type TFT. Therefore, the preparation method may save two photolithography processes, so that preparations process of the low temperature poly-silicon TFT array substrate is simplified, and the productions cost of the low temperature poly-silicon TFT array substrate is reduced.

In an exemplary manner illustrated in FIG. 1, before forming an amorphous silicon layer on the base substrate where the patterns of the light-shielding layers have been formed in step S103, the method further comprises:

Step S102: depositing a buffer layer 30 on the base substrate 10 where the patterns of the light-shielding layers 20 have been formed.

Figure 8:
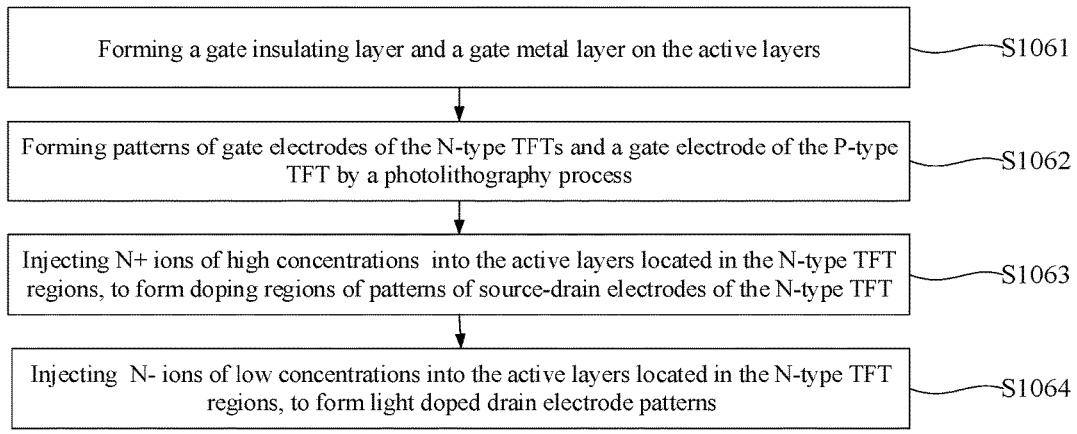
FIG. 8 is an exemplary flowchart of step S106 illustrated in FIG. 1.
Figure 9:
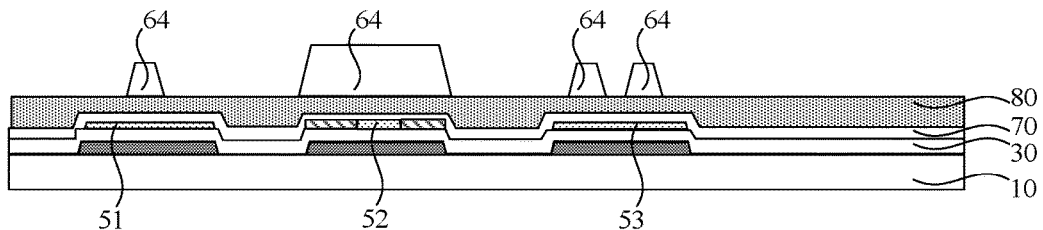
FIG. 9 is a structural schematic diagram of the array substrate after forming a gate insulating layer and a gate metal layer on the active layer illustrated in FIG. 7.

Referring to FIG. 8, in some embodiments of the present disclosure, in step S106, the operations of forming a pattern of a gate electrode of an N-type TFT and a pattern of a gate electrode of a P-type TFT by a third patterning process may include:

Step S1061: further as illustrated in FIG. 9, forming a gate insulating layer 70 and a gate metal layer 80 on the active layers 51, 52 and 53, and forming a photoresist layer on the gate metal layer 80, forming patterns of the photoresist layers 64 by exposing and developing.

Figure 10:
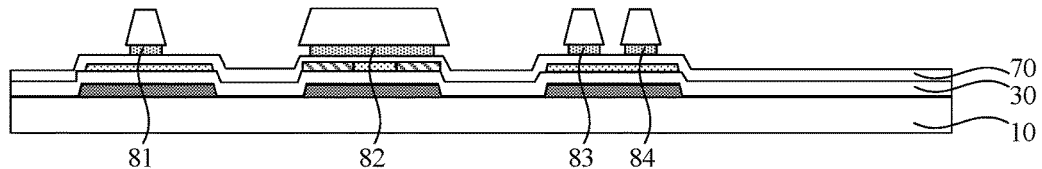
FIG. 10 is a structural schematic diagram of the array substrate after forming patterns of gate electrodes of an N-type TFT and a P-type TFT by etching the gate metal layer illustrated in FIG. 9.

Step S1062: further as illustrated in FIG. 10, etching the gate metal layer 80 located outside the patterns of the photoresist layers 64 by using a photolithography process, to form patterns of gate electrodes 81, 83 and 84 of the N-type TFTs and a pattern of a gate electrode 82 of the P-type TFT.

Figure 11:
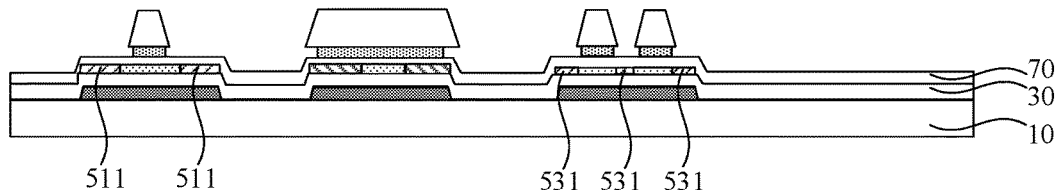
FIG. 11 is a structural schematic diagram of the array substrate after forming patterns of an active layer and a source-drain electrodes of an N-type TFT by injecting N+ ions of high concentrations into the active layer located in the N-type TFT regions illustrated in FIG. 10.

Step S1063: further as illustrated in FIG. 11, injecting N+ ions of high concentrations into the active layers located in the N-type TFT regions, to form doping regions 511 and 531 of patterns of source-drain electrodes of the N-type TFT.

Figure 12:
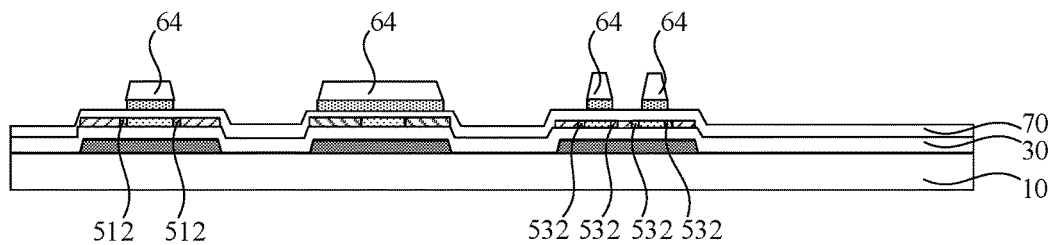
FIG. 12 is a structural schematic diagram of the array substrate after forming lightly doped drain electrode patterns by injecting N− ions of low concentrations into the active layer located in the N-type TFT regions illustrated in FIG. 11.

Step S1064: further as illustrated in FIG. 12, ashing the patterns of the photoresist layers 64, and injecting N− ions of low concentrations into the active layers 51 and 53 located in the N-type TFT regions, to form lightly doped drain electrode patterns 512 and 532.

For example, the operations of injecting N+ ions of high concentrations into the active layers located in the N-type TFT regions may be implemented with hydrogen phosphide as an active gas.

Figure 13:
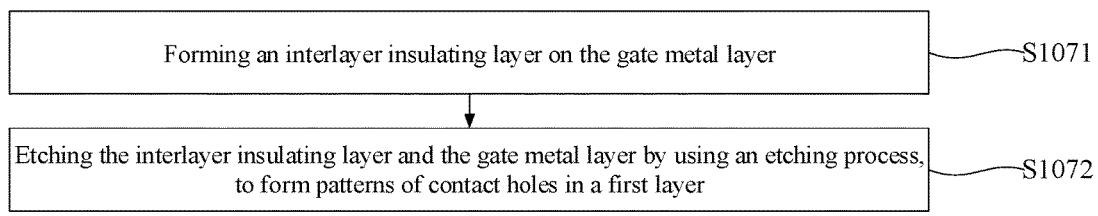
FIG. 13 is an exemplary flowchart of step S107 illustrated in FIG. 1.
Figure 14:
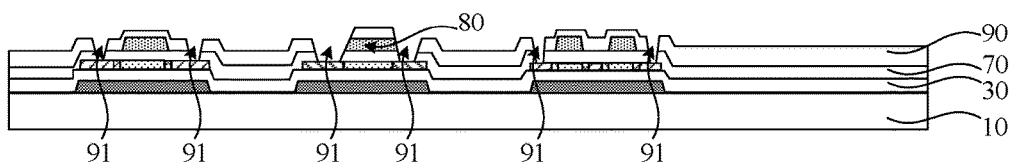
FIG. 14 is a structural schematic diagram of the array substrate after forming an interlayer insulating layer and forming patterns of contact holes in a first layer on the gate metal layer illustrated in FIG. 12.

Referring to FIG. 13, in some embodiments of the present disclosure, in step S107, the operations of forming an interlayer insulating layer and patterns of contact holes in a first layer by a fourth patterning process may include:

Step S1071: further as illustrated in FIG. 14, forming an interlayer insulating layer 90 on the gate metal layer 80.

Step S1072: further as illustrated in FIG. 14, etching the interlayer insulating layer 90 and the gate metal layer 80 by using an etching process, to form patterns of contact holes in a first layer 91.

Figure 15:
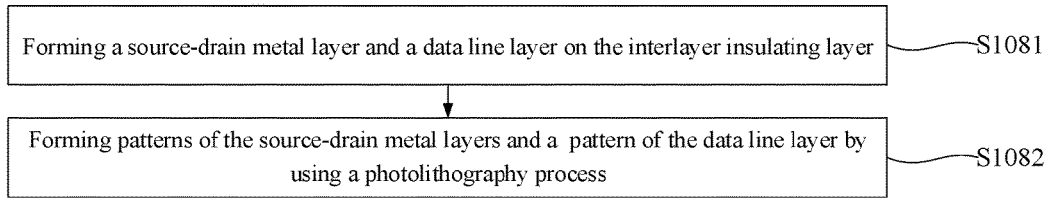
FIG. 15 is an exemplary flowchart of step S108 illustrated in FIG. 1.

Referring to FIG. 15, in an exemplary manner, in step S108, the operations of forming patterns of source-drain electrodes and a pattern of a data line by a fifth patterning process specifically includes:

Step S1081: forming a source-drain metal layer and a data line layer on the interlayer insulating layer 90.

Figure 16:
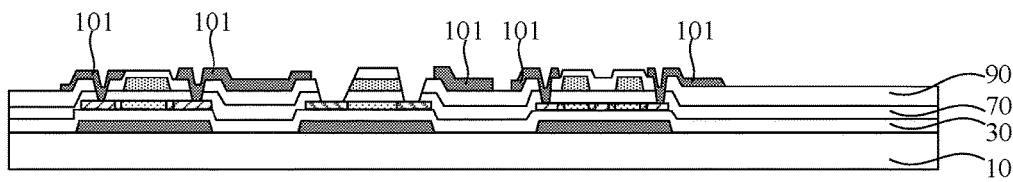
FIG. 16 is a structural schematic diagram of the array substrate after forming patterns of a source-drain metal layer and a data line layer on the interlayer insulating layer illustrated in FIG. 14.

Step S1082: further as illustrated in FIG. 16, forming patterns of the source-drain metal layers 101 and a pattern of the data line layer by using a photolithography process.

Figure 17:
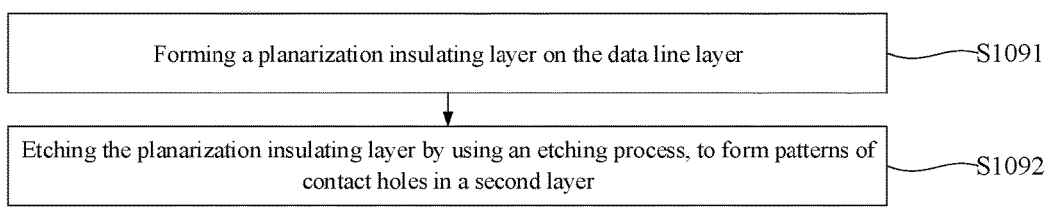
FIG. 17 is an exemplary flowchart of step S109 illustrated in FIG. 1.
Figure 18:
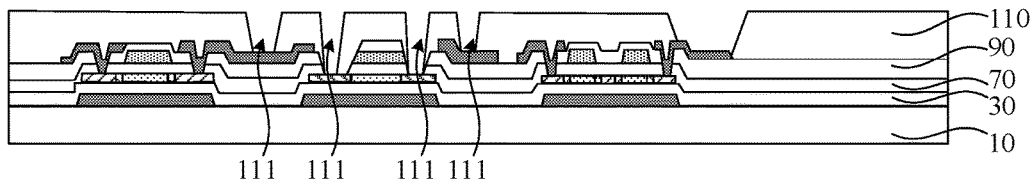
FIG. 18 is a structural schematic diagram of the array substrate after forming a planarization insulating layer and forming patterns of contact holes in a second layer on the data line layer illustrated in FIG. 16.

Referring to FIG. 17, in some embodiments of the present disclosure, in step S109, the operations of forming a planarization insulating layer and forming a pattern of contact holes in a second layer by a sixth patterning process may include:

Step S1091: further as illustrated in FIG. 18, forming a planarization insulating layer 110 on the data line layer.

Step S1092: further as illustrated in FIG. 18, etching the planarization insulating layer 110 by using an etching process, to form patterns of contact holes in a second layer 111.

Figure 19:
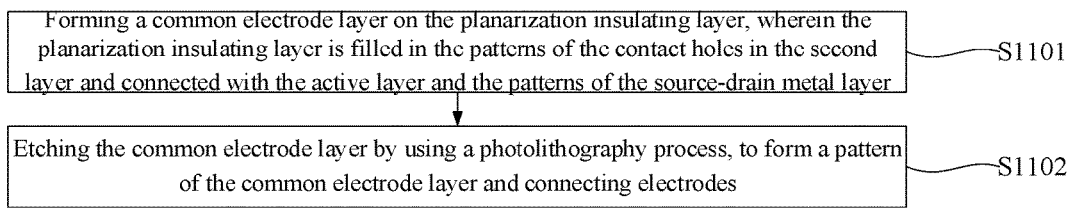
FIG. 19 is an exemplary flowchart of step S110 illustrated in FIG. 1.
Figure 20:
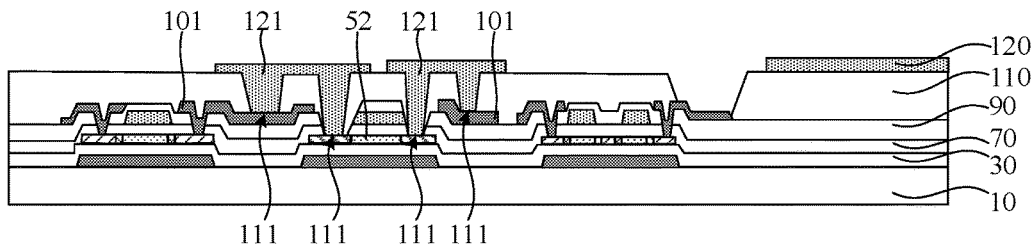
FIG. 20 is a structural schematic diagram of the array substrate after forming a common electrode on the planarization insulating layer illustrated in FIG. 18 and forming connecting electrodes.

Referring to FIG. 19, in some embodiments of the present disclosure, in step S110, the operations of forming a pattern of a common electrode and connecting electrodes for the source-drain electrodes and the active layers by a seventh patterning process may include:

Step S1101: further as illustrated in FIG. 20, forming a common electrode layer 120 on the planarization insulating layer 110, wherein the planarization insulating layer 110 is filled in the patterns of the contact hole 111 in the second layer and connected with the active layer 52 and the patterns of the source-drain metal layer 101.

Step S1102: further as illustrated in FIG. 20, etching the common electrode layer 120 by using a photolithography process, to form a pattern of the common electrode layer 120 and connecting electrodes 121.

In step S110, the connecting electrodes 121 for connecting the active layer 52 and the patterns of the source-drain metal layers 101 of the P-type TFT are formed while the common electrode layer 120 is formed, which saves a photolithography process for forming patterns of the source-drain electrodes of the P-type TFT, so that productions cost of the TFT array substrate is reduced. In addition, because the connecting electrodes 121 are made of a transparent material, an aperture ratio of the TFT is improved.

Referring to FIG. 1, in some embodiments of the present disclosure, in step S110, after forming the pattern of the common electrode between the N-type TFT and the P-type TFT and allowing the common electrode in contact with the active layer and source-drain electrodes of the P-type TFT, the method may further include:

Step S111: forming a pattern of a protective layer on the common electrode layer by an eighth patterning process.

Step S112: forming a pattern of a pixel electrode on the protective layer by a ninth patterning process.

Figure 21:
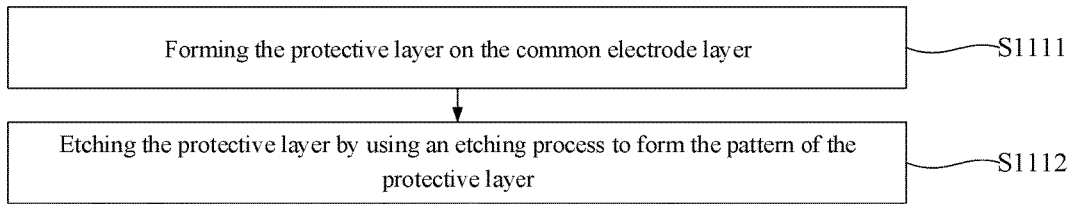
FIG. 21 is an exemplary flowchart of step S111 illustrated in FIG. 1.
Figure 22:
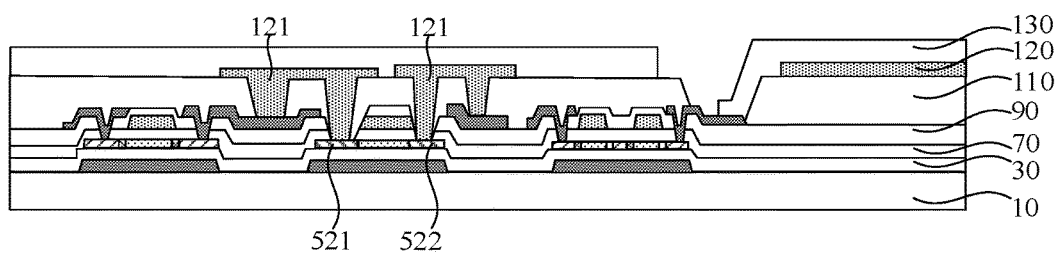
FIG. 22 is a structural schematic diagram of the array substrate after forming a pattern of a protective layer on the common electrode layer illustrated in FIG. 20.

Referring to FIG. 21, in step S111, the operations of forming the pattern of the protective layer on the common electrode layer by an eighth patterning process may include:

Step S1111: further as illustrated in FIG. 22, forming the protective layer 130 on the common electrode layer 120.

Figure 23:
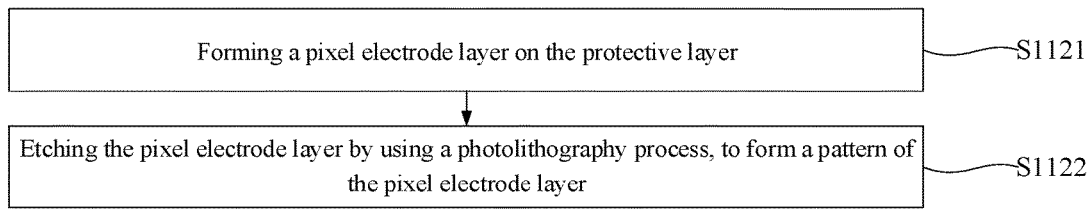
FIG. 23 is an exemplary flowchart of step S112 illustrated in FIG. 1.
Figure 24:
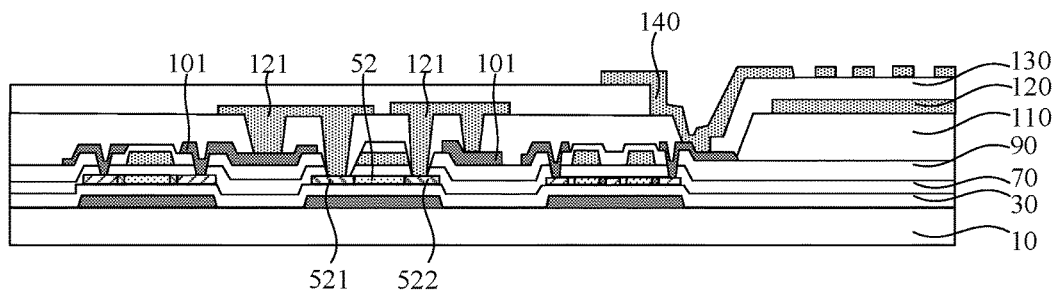
FIG. 24 is a structural schematic diagram of the array substrate after forming a pattern of a pixel electrode on the protective layer illustrated in FIG. 22.

Step S1112: etching the protective layer 130 by using an etching process to form the pattern of the protective layer;

Referring to FIG. 23, in step S112, the operations of forming the pattern of the pixel electrode on the protective layer by a ninth patterning process may include:

Step S1121: further as illustrated in FIG. 24, forming a pixel electrode layer 140 on the protective layer 130.

Step S1122: etching the pixel electrode layer 140 by using a photolithography process, to form a pattern of the pixel electrode layer.

In conclusion, there are totally nine times of patterning processes in the preparation method, which saves the photolithography process (patterning process) for separately forming the pattern of the active layer of the P-type TFT and the photolithography process (patterning process) for separately forming the pattern of the source-drain electrodes of the P-type TFT, so that the number of times of the photolithography processes is reduced, preparations process of an array substrate is simplified, and the productions cost for an array substrate is reduced.

As illustrated in FIG. 24, an embodiment of the present disclosure further provides a low temperature poly-silicon TFT array substrate prepared by any one of the exemplary preparation methods described above, and in the array substrate, doping regions 521 and 522 of the patterns of the source-drain electrodes of a P-type TFT are connected with the source-drain electrodes of the P-type TFT through transparent connecting electrodes 121.

In the low temperature poly-silicon TFT arrays substrate, the doping regions 521 and 522 of the pattern of the source-drain electrodes of the P-TFT are in contact with the transparent connecting electrodes 121 located between an N-type TFT and the P-TFT, and because the transparent connecting electrodes 121 are used as source-drain electrodes of the P-type TFT, an aperture ratio of the TFT is improved.

The foregoing embodiments merely are exemplary embodiments of the present disclosure, and not intended to define the scope of the present disclosure, and the scope of the present disclosure is determined by the appended claims.

The present applications claims priority of Chinese Patent Applications No. 201510673823.5 filed on Oct. 16, 2015, the disclosure of which is incorporated herein by reference in its entirety as part of the present application.

What is claimed is:

1. A preparation method of a poly-silicon thin film transistor (TFT) array substrate, comprising:
   forming patterns of light-shielding layers and a poly-silicon layer on a base substrate by a first patterning process;
   performing a second patterning process, to form a photoresist layer on the poly-silicon layer, and exposing and developing the photoresist layer with a gray tone mask to form patterns of a photoresist completely-reserved region, a photoresist partially-reserved regions and a photoresist completely-removed region;
   removing part of the poly-silicon layer located in the photoresist completely-removed regions to form patterns of active layers;
   ashing the photoresist so as to expose part of the active layers located in the photoresist partially-reserved regions and inject P+ ions of high concentrations into the part of the active layers, to form doping regions of patterns of source-drain electrodes of a P-type TFT; and
   stripping off remaining photoresist.

2. A poly-silicon thin film transistor (TFT) array substrate prepared by the preparation method according to claim 1,
   wherein, in the array substrate, doping regions of patterns of source-drain electrodes of a P-type TFT is connected with the source-drain electrodes of the P-type TFT through transparent connecting electrodes.

3. The preparation method according to claim 1, wherein, forming of the patterns of light-shielding layers and the poly-silicon layer on the base substrate by the first patterning process includes:
   forming an amorphous silicon layer on the base substrate where the patterns of the light-shielding layers have been formed, and dehydrogenizing the amorphous silicon layer; and
   crystallizing the dehydrogenized amorphous silicon layer to convert the dehydrogenized amorphous silicon layer into the poly-silicon layer.

4. The preparation method according to claim 3, wherein, before forming of the amorphous silicon layer on the base substrate where the patterns of the light-shielding layers have been formed, the method further comprises:
   depositing a buffer layer on the base substrate where the patterns of the light-shielding layers have been formed.

5. The preparation method according to claim 1, further comprising:
   forming a pattern of a gate electrode of an N-type TFT and a pattern of a gate electrode of a P-type TFT by a third patterning process;
   forming an interlayer insulating layer and patterns of contact holes in a first layer by a fourth patterning process;
   forming patterns of source-drain electrodes and a pattern of a data line by a fifth patterning process;
   forming a pattern of a planarization insulating layer and forming patterns of contact holes in a second layer by a sixth patterning process; and
   forming a pattern of a common electrode and connecting electrodes for the source-drain electrodes and the active layer by a seventh patterning process.

6. The preparation method according to claim 5, wherein, forming of the interlayer insulating layer and patterns of contact holes in the first layer by the fourth patterning process further includes:
   forming the interlayer insulating layer on the gate metal layer;
   etching the interlayer insulating layer and the gate metal layer by using an etching process, to form patterns of contact holes in the first layer.

7. The preparation method according to claim 5, wherein, forming of patterns of source-drain electrodes and the pattern of the data line by the fifth patterning process includes:
   forming a source-drain metal layer and a data line layer on the interlayer insulating layer; and
   forming patterns of the source-drain metal layer and the data line layer by a photolithography process.

8. The preparation method according to claim 5, wherein, forming of a planarization insulating layer and forming patterns of contact holes in the second layer by the sixth patterning process includes:
   forming the planarization insulating layer on the data line layer; and
   etching the planarization insulating layer by using an etching process to form a pattern of contact holes in the second layer.

9. The preparation method according to claim 5, wherein, forming of the pattern of the common electrode and connecting electrodes for the source-drain electrodes and the active layer by the seventh patterning process includes:
   forming a common electrode layer on the planarization insulating layer, the common electrode layer being filled in the contact holes of the second layer to connect the source-drain electrodes and the active layers; and
   etching the common electrode layer by using an etching process, to form the pattern of the common electrode layer and patterns of the connecting electrodes.

10. The preparation method according to claim 5, wherein, after forming of the pattern of the common electrode and connecting electrodes for the source-drain electrodes and the active layer, the method further comprises:
    forming a pattern of a protective layer on the common electrode layer by an eighth patterning process; and
    forming a pattern of a pixel electrode on the protective layer by a ninth patterning process.

11. The preparation method according to claim 5, wherein, forming of the pattern of the gate electrode of the N-type TFT and the pattern of the gate electrode of the P-type TFT by the third patterning process includes:
    forming a gate insulating layer and a gate metal layer on the active layer;
    forming patterns of the gate electrode of the N-type TFT and the gate electrode of the P-type TFT by a photolithography process;
    injecting N+ ions of high concentrations into part of the active layer located in the N-type TFT regions to form doping regions of patterns of source-drain electrodes of the N-type TFT; and
    injecting N− ions of low concentrations into part of the active layer located in the N-type TFT regions to form lightly doped drain electrode patterns.

12. The preparation method according to claim 11, wherein, injecting of N+ ions of high concentrations into the active layer located in the N-type TFT regions is implemented with hydrogen phosphide.

* * * * *